(12) United States Patent
Hirafuji et al.

(10) Patent No.: US 7,448,876 B2
(45) Date of Patent: Nov. 11, 2008

(54) PC CARD, PC CARD HOUSING, AND PC CARD MOUNTING CONFIGURATION

(75) Inventors: Kazuo Hirafuji, Kawasaki (JP);
Yoshihisa Nakagawa, Kawasaki (JP);
Hideki Sonobe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/635,139

(22) Filed: Dec. 7, 2006

(65) Prior Publication Data

US 2008/0045068 A1 Feb. 21, 2008

(30) Foreign Application Priority Data

Aug. 17, 2006 (JP) .............. 2006-222336

(51) Int. Cl.
*H05K 7/20* (2006.01)

(52) U.S. Cl. .................. 439/61; 439/76.1; 439/79

(58) Field of Classification Search ............. 439/76.1, 439/61, 64, 79; 361/736, 752, 754, 756, 361/759, 802, 799, 796, 785
See application file for complete search history.

(56) References Cited

U.S. PATENT DOCUMENTS

| | | | | | |
|---|---|---|---|---|---|
| 3,177,404 | A | * | 4/1965 | Patmore | 361/683 |
| 3,200,361 | A | * | 8/1965 | Schwartz et al. | 439/76.1 |
| 3,243,660 | A | * | 3/1966 | Yuska | 361/709 |
| 3,506,877 | A | * | 4/1970 | Owen | 361/715 |
| 3,851,222 | A | * | 11/1974 | Michalak et al. | 361/757 |
| 4,179,172 | A | * | 12/1979 | Godsey et al. | 439/61 |
| 4,388,671 | A | * | 6/1983 | Hall et al. | 361/682 |
| 4,417,778 | A | * | 11/1983 | Halvorsen et al. | 439/61 |
| 4,441,140 | A | * | 4/1984 | Richard | 361/720 |
| 4,452,359 | A | * | 6/1984 | Koppensteiner | 211/41.17 |
| 4,894,753 | A | * | 1/1990 | Wadell et al. | 361/818 |
| 5,099,391 | A | * | 3/1992 | Maggelet et al. | 361/736 |
| 5,125,854 | A | * | 6/1992 | Bassler et al. | 439/607 |
| 5,234,348 | A | * | 8/1993 | Konsevich et al. | 439/61 |
| 5,394,305 | A | * | 2/1995 | Moral et al. | 361/796 |
| 5,398,164 | A | * | 3/1995 | Goodman et al. | 361/752 |
| 5,432,682 | A | * | 7/1995 | Giehl et al. | 361/796 |
| 5,513,995 | A | * | 5/1996 | Kurotori et al. | 439/64 |
| 6,045,385 | A | * | 4/2000 | Kane | 439/327 |
| 6,144,561 | A | * | 11/2000 | Cannella et al. | 361/796 |
| 7,112,070 | B2 | * | 9/2006 | Huang | 439/79 |

FOREIGN PATENT DOCUMENTS

| | | |
|---|---|---|
| JP | 58-51482 | 4/1983 |
| JP | 63-43399 | 2/1988 |

* cited by examiner

*Primary Examiner*—Neil Abrams
(74) *Attorney, Agent, or Firm*—Katten Muchin Rosenman LLP

(57) ABSTRACT

The card mounting configuration includes a card with a height that is approximately half that of conventional cards and integration of a front plate and a back plate of the card with a support to prevent circuit board distortion. A card ejector is attached on the front plate, and a plug-in connector is provided on the back plate. A housing with guides to receive the cards contains two levels, upper and lower, wherein six cards are mounted into each level. A plug-in connector on the card passes through a hole in a back board or supplemental backplane of the housing and is connected to a part of an external line connector that appears inside the housing.

14 Claims, 12 Drawing Sheets

PRIOR ART FIG.13
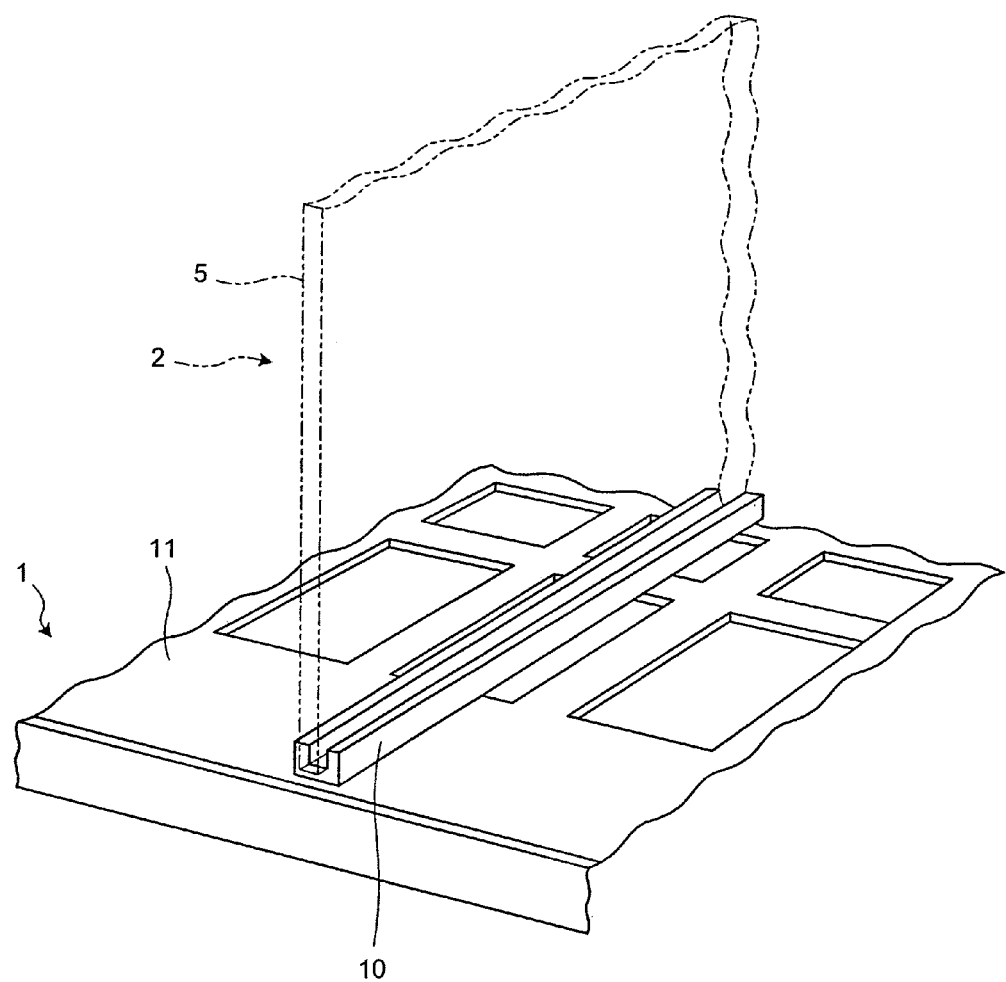

PC CARD, PC CARD HOUSING, AND PC CARD MOUNTING CONFIGURATION

CROSS-REFERENCE TO RELATED APPLICATIONS

This application is based upon and claims the benefit of priority from the prior Japanese Patent Application No. 2006-222336, filed on Aug. 17, 2006, the entire contents of which are incorporated herein by reference.

BACKGROUND OF THE INVENTION

1. Field of the Invention

The present invention relates to a PC card, a PC card housing, and PC card mounting configuration.

2. Description of the Related Art

Cards that house printed circuit boards (PCB) are commonly known as PC cards (henceforth, simply referred to as "cards") and in general, with wireless communication, a plurality of PC cards is mounted such that removal is also possible. FIG. 11 is a perspective view of a conventional card mounting configuration, viewed from a rear of a device. As illustrated in FIG. 11, in the conventional card mounting configuration, twelve cards 2 are vertically mounted in a single, horizontal row in a housing 1. In the figure, a storage space 3 for each card 2 is indicated by a dotted reference line. However, in actuality there is no partition.

For the convenience of explanation, of the storage spaces 3, two adjacent ones shall be referred to as 3a and 3b, wherein 3a is a first storage space and 3b is a second storage space. The first storage space 3a and the second storage space 3b are arranged in alternating positions six times. An external line connector 4 is for connection to an external device via cable (not shown in the drawing). The external line connector 4 is provided and accessible on a back panel of the device. At a top and a bottom of each storage space 3, one connector is provided, i.e., each storage space 3 is provided with two connectors.

As for connectors of the first storage space 3a, a first upper external line connector shall be 4a and a first lower line connector, 4b. Furthermore, in the same manner, for the second storage space 3b, a second upper external line connector shall be 4c and a second lower external line connector shall be 4d. The following constraints exist with the arrangement of the present external line connectors 4a, 4b, 4c, 4d.

A distance X between a center of the first lower external line connector 4b (the first upper external line connector 4a) and a center of the second lower external connector 4d (the second upper external line connector 4c), a distance Y between a center of the second upper external line connector 4c and that of the first lower connector 4b, as well as a distance Z between a center of the first lower connector 4b (the first upper connector 4a) and a center of the second lower connector 4d (the second upper connector 4c) are configured for easy cable connection by the user. As illustrated in FIG. 11, in the case that the external line connector 4 arrangement is staggered, the device becomes smaller.

FIG. 12 is a diagram illustrating a conventional card structure, and a connection between the card and external line connectors. Conventional cards 2 have a wiring pattern, as shown in FIG. 12, with an ejector 6 for removing cards from and mounting cards into the housing 1 and a band-like support to prevent card distortion, both of which are attached to a printed circuit board (PCB) 5 that includes a mounted electrical component. Two connection terminals 8a, 8b for connections to the external line connectors 4a, 4b, 4c, 4d are installed on a rear end of the PCB 5.

The cards 2 mounted into the first storage space 3a of the housing 1 and the second storage space 3b have the same structure. Hence, the height of the connection terminals 8a, 8b can not be aligned to the heights of the upper and lower external line connectors 4a, 4b of the first storage space 3a and to those of the second storage space 3b, i.e., connection terminals 8a, 8b can not be directly connected to the upper and lower external line connectors 4a, 4b of the first storage space 3a and to the upper and lower external line connectors 4c, 4d of the second storage space 3b.

Therefore, with conventional devices, cables 9a, 9b are used for a connection between the connection terminals 8a, 8b and the external line connectors 4a, 4b, 4c, 4d. In FIG. 12, when a card 2 is mounted in the first storage space 3a or in the second storage space 3b, the respective cables 9a, 9b are each indicated by both a solid and a dotted line.

FIG. 13 depicts a portion of a bottom panel 11 of the conventional housing. As shown in FIG. 13, the housing 1 has a U-shaped resin rail 10 fixed to a top-side of the bottom panel 11 and to an under-side of a top panel (not shown). The present rail 10 runs from a front opening of the housing 1 back to the back panel and guides the card 2 (indicated in FIG. 13 by a dotted line) as the card 2 is inserted into the storage space 3.

There are structures that provide direct connection of a card connection terminal and an external line connector of a housing without use of cables, e.g., a shelf of a plug-in sheet, wherein a back board equipped with a back board connector (formed by a contact pin that pierces both sides of a circuit board) and a PCB, both of which include a connection sheet that includes a sheet connector and an external line connector on each end, wherein the sheet connector is inserted into one side of the back board connector and a connection with the external cable via external line connector is made. Japanese Patent Laid-Open Publication No. S63-43399 is an example for reference.

Further, there are also devices that include a plurality of guide rails in a housing to guide insertion of a PCB on two sides. A connector on an end of a PCB is connected to a respective connector of a mother board located in a bottom of the housing. Subsequently, an electronic component is connected to an external cable that is connected to each PCB via an external line connector. A PCB mounting configuration follows for reference. On both sides of a bottom panel is a first side panel for attachment to a housing and a second side panel including parallel guides on a front end of the bottom panel that are integrated by a P-shaped PCB bracket. One side of the PCB is fixed to a bottom plate of the bracket and another side of the PCB is connected and fixed to the external line connector. The PCB is inserted into the housing by introducing a guide portion of the bracket and another side of the PCB to the guide rails, wherein the P-shaped bracket is fixed to the first side panel of the housing. Japanese Utility Model Publication No S58-51482 is an example for reference.

With conventional cable connection configurations, the connection between the connection terminal of the card and the external line connector of the housing via cable only allows a small space of approximately 7 centimeters (cm) between the rear end of the card and back panel of the housing for an operator to conduct required cable connections. For every one card, two cables are required and as such in a 12-card mounted device at least twenty-four cables must be wired and fit into the small space without interfering with each other. As a result, tremendous installation time is required.

Moreover, with the aforementioned cable connection configuration, each PCB must be equipped with an ejector and a band-like support to prevent distortion. Hence, a margin of error in the installation position of PCB ejectors and distortion preventing supports substantially increases, thereby preventing the realization of a high quality product at a low cost.

Furthermore, with the conventional card mounting configuration, a plurality of cards is aligned in a single horizontal row and as such a space between adjacent cards is minimal. As a result, during operation of the device, an internal temperature of the device is prone to rise. Another disadvantage lies with a size of the device. Due to rails fixed to a top panel and a bottom panel of a housing of the device, a distance between the top and bottom panels must, in addition to a height of the card, compensate for a thickness of the upper and lower rails, thereby limiting a minimum size of the device.

SUMMARY OF THE INVENTION

It is an object of the present invention to at least solve the above problems in the conventional technologies.

A card according to one aspect of the present invention includes a printed circuit board that includes a circuit pattern and an electronic component; a front plate that is substantially perpendicularly attached to a front end of the printed circuit board; a back plate that is substantially perpendicularly attached to a rear end of the printed circuit board; and a support to prevent card distortion that is attached along a direction of a length of the printed circuit board. A front end and a rear end of the support are supported by the front and the back plates, and the back plate includes a plurality of plug-in connectors that is connected to an external line connector of a housing by a plug-in configuration.

A housing according to another aspect of the present invention includes an upper shelf that is formed by a first upper panel and a first lower panel, the upper shelf in which a plurality of cards is arranged in a single row; a lower shelf that is formed by a second upper panel and a second lower panel, the lower shelf in which a plurality of cards is arranged in a single row; a pair of side panels that support the first upper panel, the first lower panel, the second upper panel, and the second lower panel; a back panel to cover a back side of the upper shelf and the lower shelf; a plurality of external line connectors protruding from the back panel; and a back board that is positioned in proximity to the back panel. The back board is provided with holes through which a plug-in connector passes for connection to the external line connector that protrudes from a back end of a card.

A card mounting configuration according to still another aspect of the present invention includes the card according to the above aspect and the housing according to the above aspect.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 13 is an oblique view of an essential part of a conventional casing.

DETAILED DESCRIPTION OF THE PREFERRED EMBODIMENTS

Exemplary embodiments according to the present invention will be explained in detail below with reference to the accompanying drawings.

Figure 1:
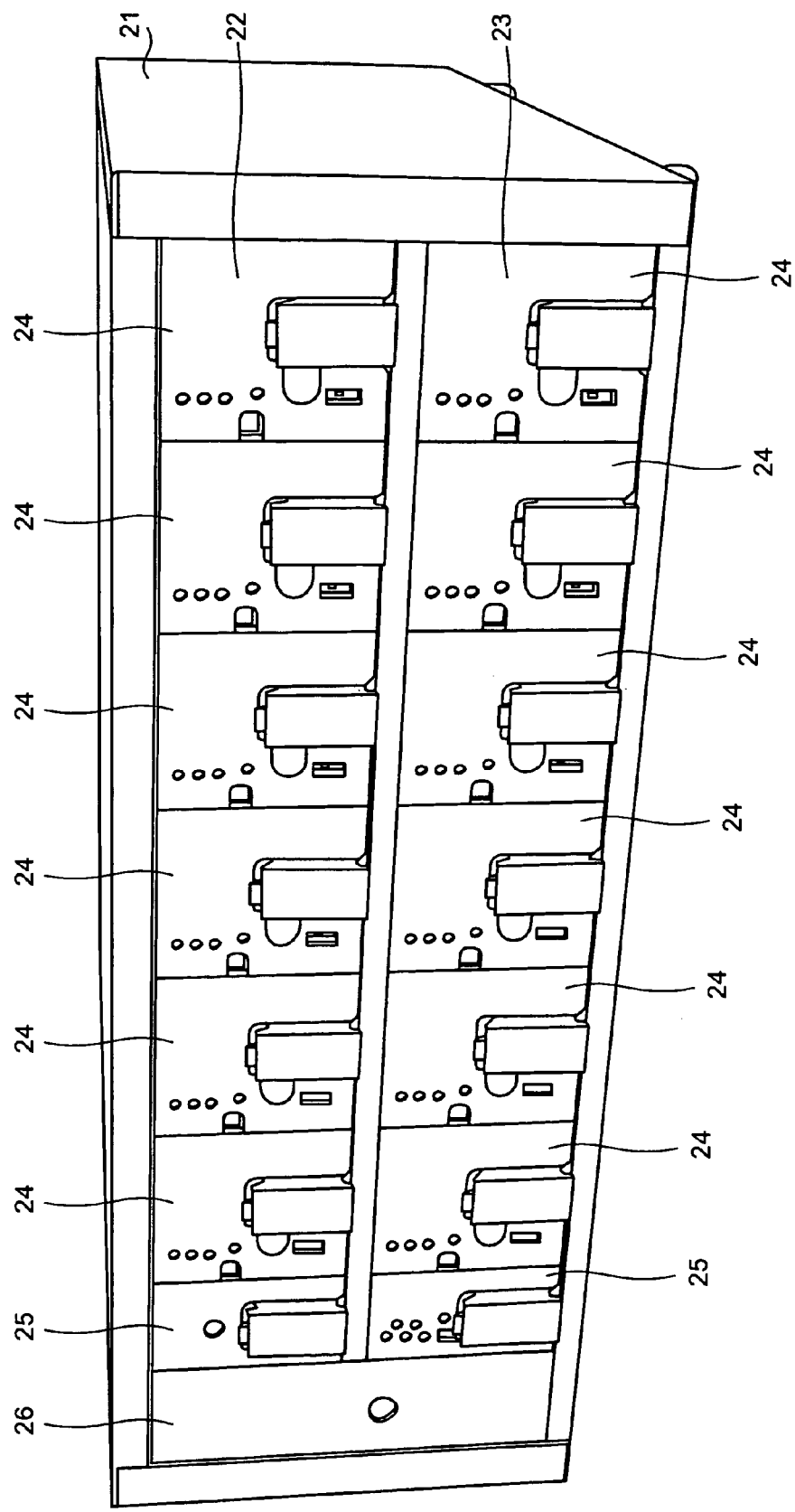
FIG. 1 is an external view of an applicable device for a card mounting configuration according to an embodiment of the present invention.

FIG. 1 is an external view of an applicable device for a card mounting configuration according to an embodiment of the present invention. FIG. 1 illustrates that for the present device, two vertical shelves 22, 23 are included in a housing 21. Cards 24 similar in structure can be inserted into each shelf 22, 23 (e.g., six per shelf). For example, if the device is a base transceiver station (BTS) for mobile telephones, as a BTS, each card 24 functions as a mobile terminal and conducts wireless transmission and receiving. Further, cards 25 with functions other than transmission and receiving functions (e.g., power supply system) as well as a grounding connection unit 26 are installed in the shelves 22, 23.

Figure 2:
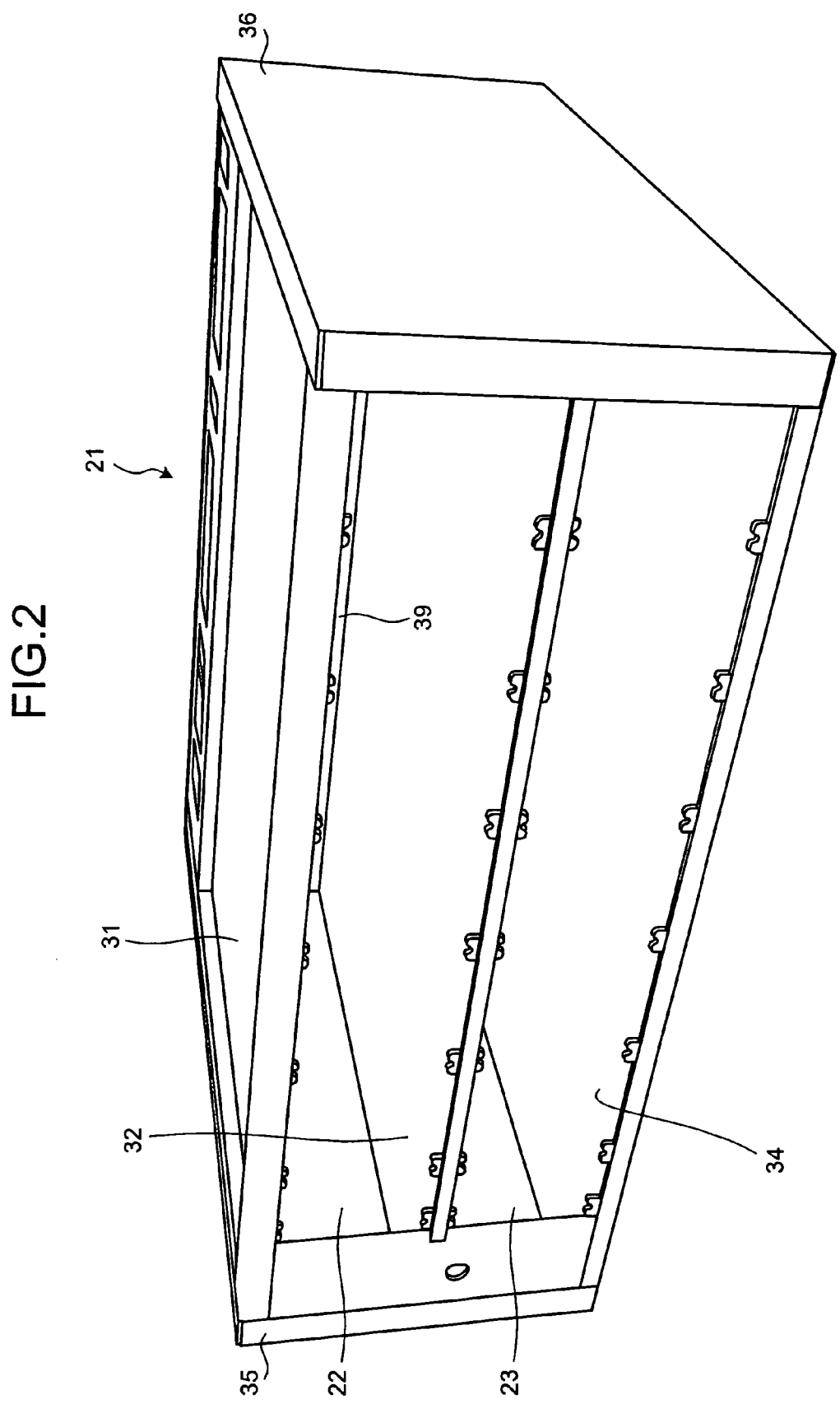
FIG. 2 is an external view of a housing according to the embodiment as viewed from a part of a front opening.
Figure 3:
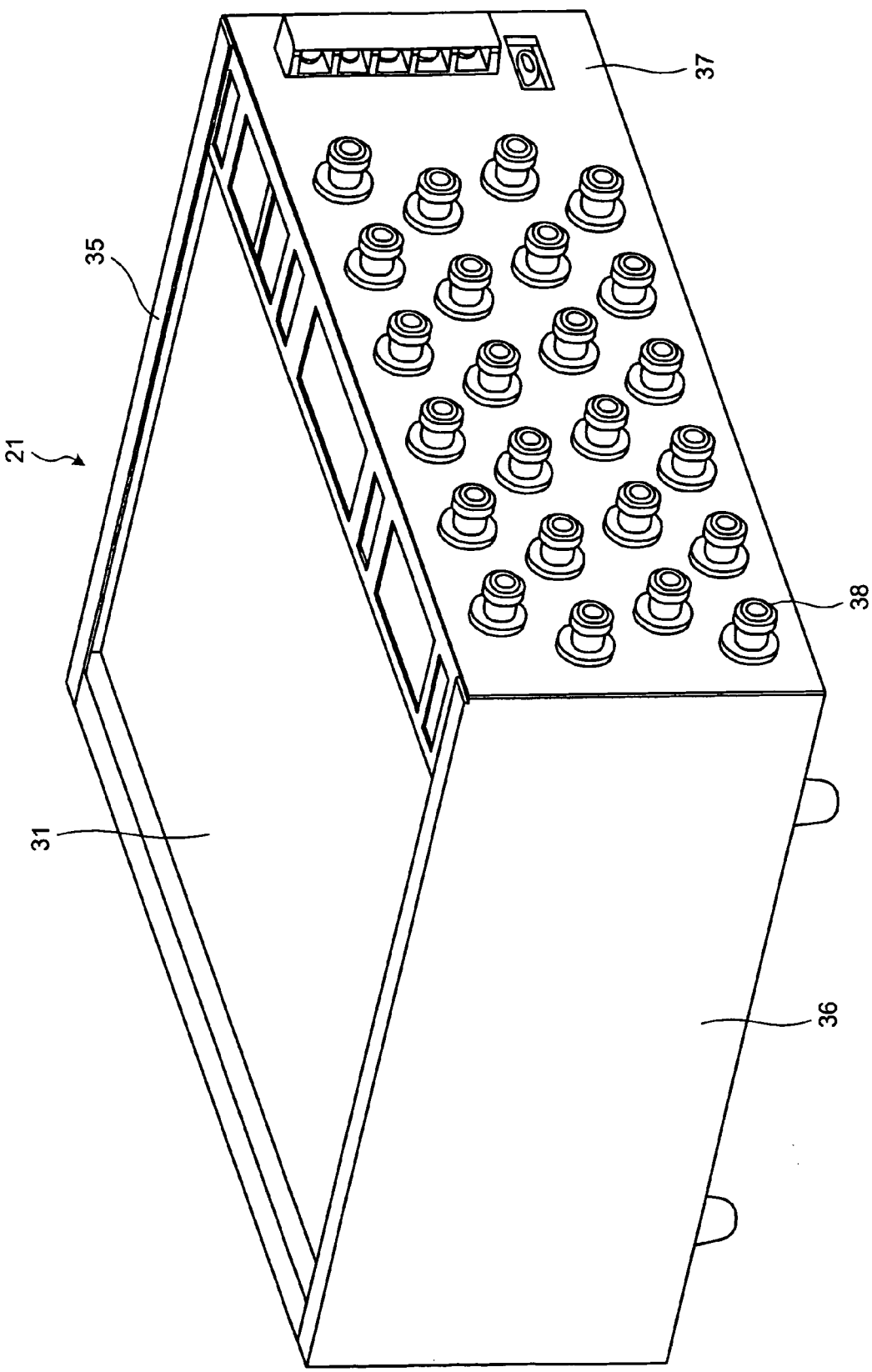
FIG. 3 is an external view of the housing as viewed from a part of a rear side.

FIG. 2 and FIG. 3 are perspective views of the housing 21 as viewed from a front opening of the housing 21 and a rear of the housing 21, respectively. As illustrated in FIG. 2, the housing 21 includes a first upper panel 31 and a first lower panel 32 that form an upper shelf 22 of the housing 21, a second upper panel (hidden by the first lower panel 32 and hence, not visible in FIG. 2) and a second lower panel 34 that form a lower shelf 23, and side panels 35, 36 that duly support both ends of each of the panels 31, 32, the second upper panel, 34 that form the upper shelf 22 and lower shelf 23.

Furthermore, as illustrated in FIG. 3, a rear of the device is covered by a back panel 37. Similarly to conventional configurations, two external line connectors 38 for each card are provided and accessible on the back panel 37. A back board 39 is provided immediately near the back panel 37 on an interior side of the housing 21. Further, an opening on the first upper panel 31, the first lower panel 32, the second upper panel, and the second lower panel 34 to dissipate heat and a guide rail are included. To maintain easy reference of FIG. 2 and FIG. 3, the openings and guide rails have been omitted from both figures.

Construction of a primary structural component of the housing 21, such as the first upper panel 31, the first lower panel 32, the second upper panel 33, the second lower panel 34, the side panels 35, 36 and the back panel 37 may, for example, be constructed of stainless steel. However, construction is not limited to stainless steel. A grounding terminal of each card that is mounted into the housing 21 is electrically connected to the primary structural components, and through the grounding connection unit 26, a grounding of the device is conducted. Further, if the housing 21 is of stainless steel construction, coating of the housing 21 is not required.

Figure 4:
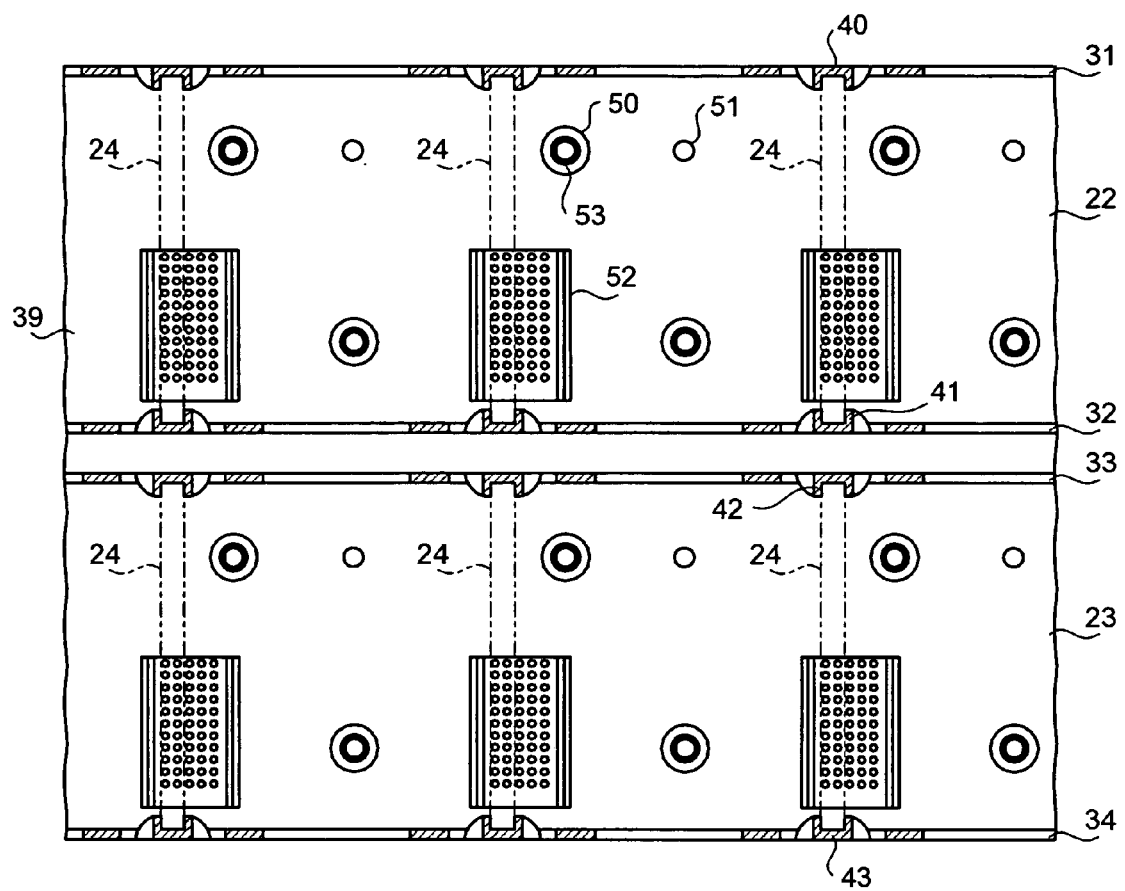
FIG. 4 is a front cross-sectional view of a part of the housing.

FIG. 4 is a front cross-sectional view of the housing 21 illustrating a guide rail 40 in a portion of the housing 21. As illustrated in the figure, by folding back a portion of the first upper panel 31 downward so that a vertical cross-sectional view of the guide rail 40 resembles a shape of an inverted U, the guide rail 40 is formed. A guide rail 41 provided on the first lower panel 32 is formed by folding back a portion of the first lower panel 32 upward so that a vertical cross-sectional view of the guide rail 40 resembles a shape of an inverted U.

A guide rail 42 provided on the second upper panel 33 and a guide rail 43 on the second lower panel 34 are similarly formed. The card 24 (precisely, a PCB of the card 24) is inserted into the housing 21 from the openings on the front side of the housing 21 between the opposing guide rails 40, 41 on the upper shelf or between the opposing guide rails 42, 43 on the lower shelf.

Figure 5:
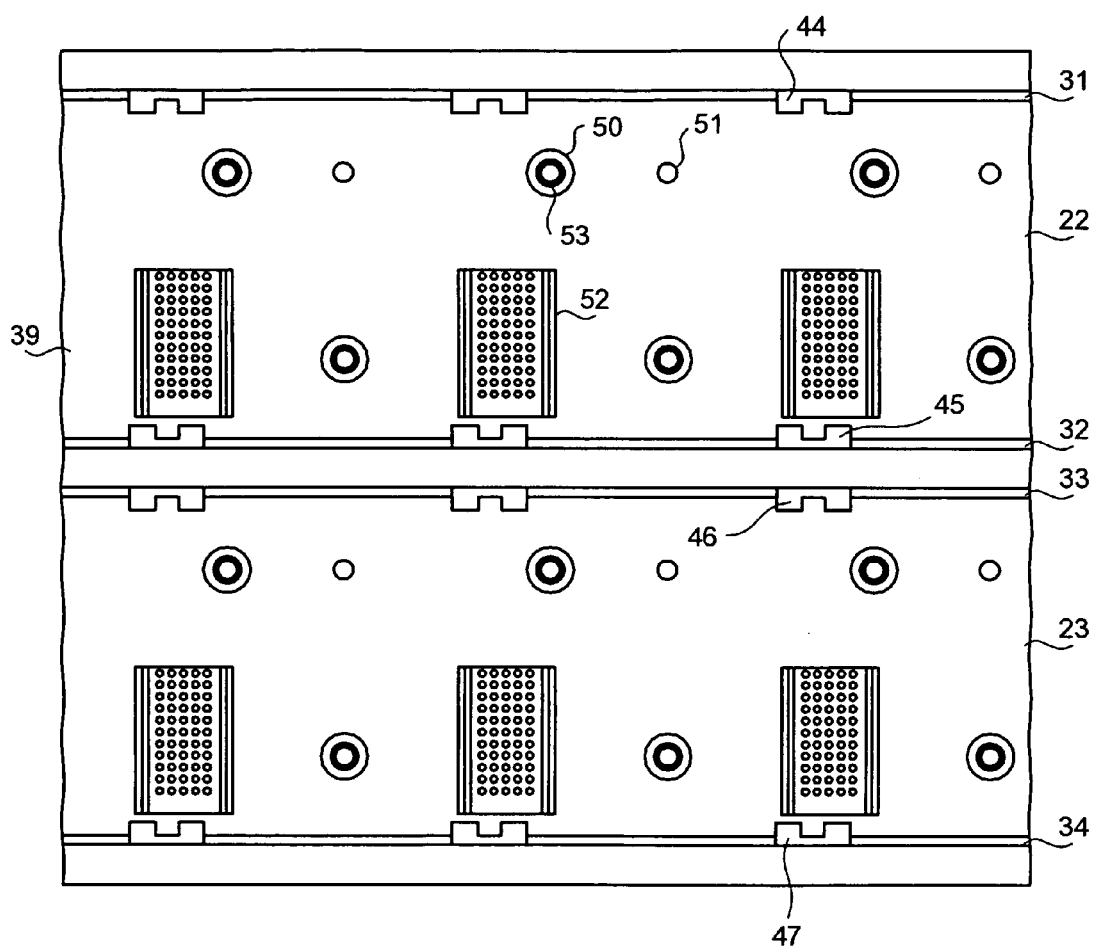
FIG. 5 is a front view of a part of the housing.
Figure 6:
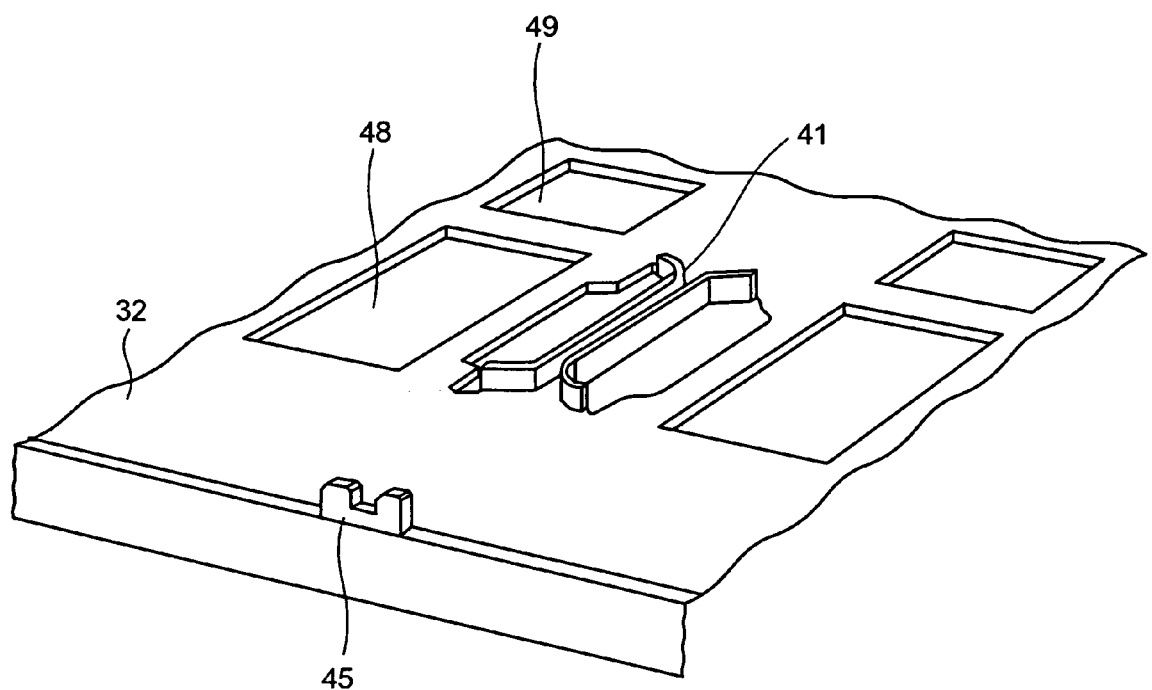
FIG. 6 is an oblique view of the housing illustrating primary parts.

FIG. 5 illustrates a portion of the housing 21. FIG. 6 illustrates chief parts of the housing 21. FIG. 5 illustrates positioning guides 44, 45, 46, 47 provided respectively on a front end of the first upper panel 31, the first lower panel 32, the second upper panel 33, and the second lower panel 34. The positioning guides 44, 45, 46, 47 are positioned as extensions of the guide rails 40, 41, 42, 43 and when the card 24 is inserted from the front opening, the positioning guides determine a mounting position of the PCB of the card 24.

As illustrated in FIG. 6, the guide rails 40, 41, 42, 43 are a distance from the front end of the first upper panel 31, the first lower panel 32, the second upper panel 33, and the second lower panel 34. However, by aligning the card 24 with the positioning guides 44, 45, 46, 47, the card 24 can be easily inserted into the guide rail. Furthermore, in FIG. 6, only the guide rail 41 of the first lower panel 32 and the positioning guide 45 are illustrated. However, the guide rail 40 of the first upper panel 31 and the positioning guide 44; the guide rail 42 of the second upper panel 33 and the positioning guide 46; and the guide rail 43 of the second lower panel 34 and the positioning guide 47 are essentially similar.

FIG. 6 is a perspective view of openings 48, 49 for heat dissipation provided in the first lower panel 32. The first upper panel 31, the second upper panel 33, and the second lower panel 34 are also provided with similar openings. Further, as illustrated in FIG. 4 and FIG. 5, a connection hole 50, a positioning hole 51, and a card connector 52 for connection to the card are provided on the back board 39.

The connection hole 50 is an opening provided in a position corresponding to the external line connector 38 and passes through the plug-in connector protruding from a back end of the card 24. In FIG. 4 and FIG. 5, within the connection hole 50 is a circular mark (referenced by reference character 53) that represents a part of the external line connector 38 exposed on an interior side of the housing 21 that can be seen through the connection hole 50. The plug-in connector is connected to this part of the external line connector 38. The positioning hole 51 is an opening through which a guide pin protruding from a back end of the card 24 passes. The card connector 52 is connected to a connector for the back board that is provided on a back end of the card 24.

Figure 7:
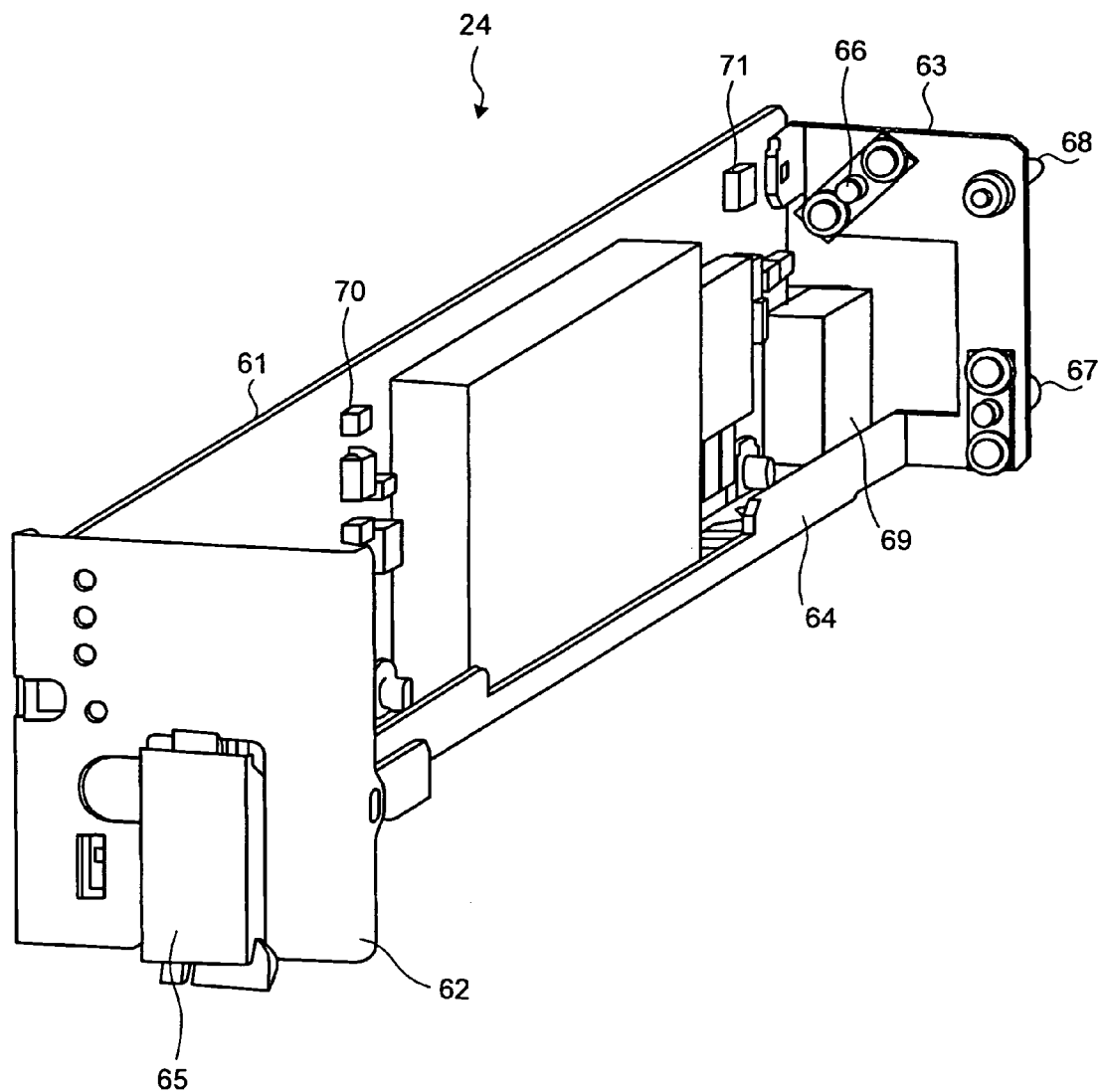
FIG. 7 is an oblique view of a card according to the embodiment.
Figure 8:
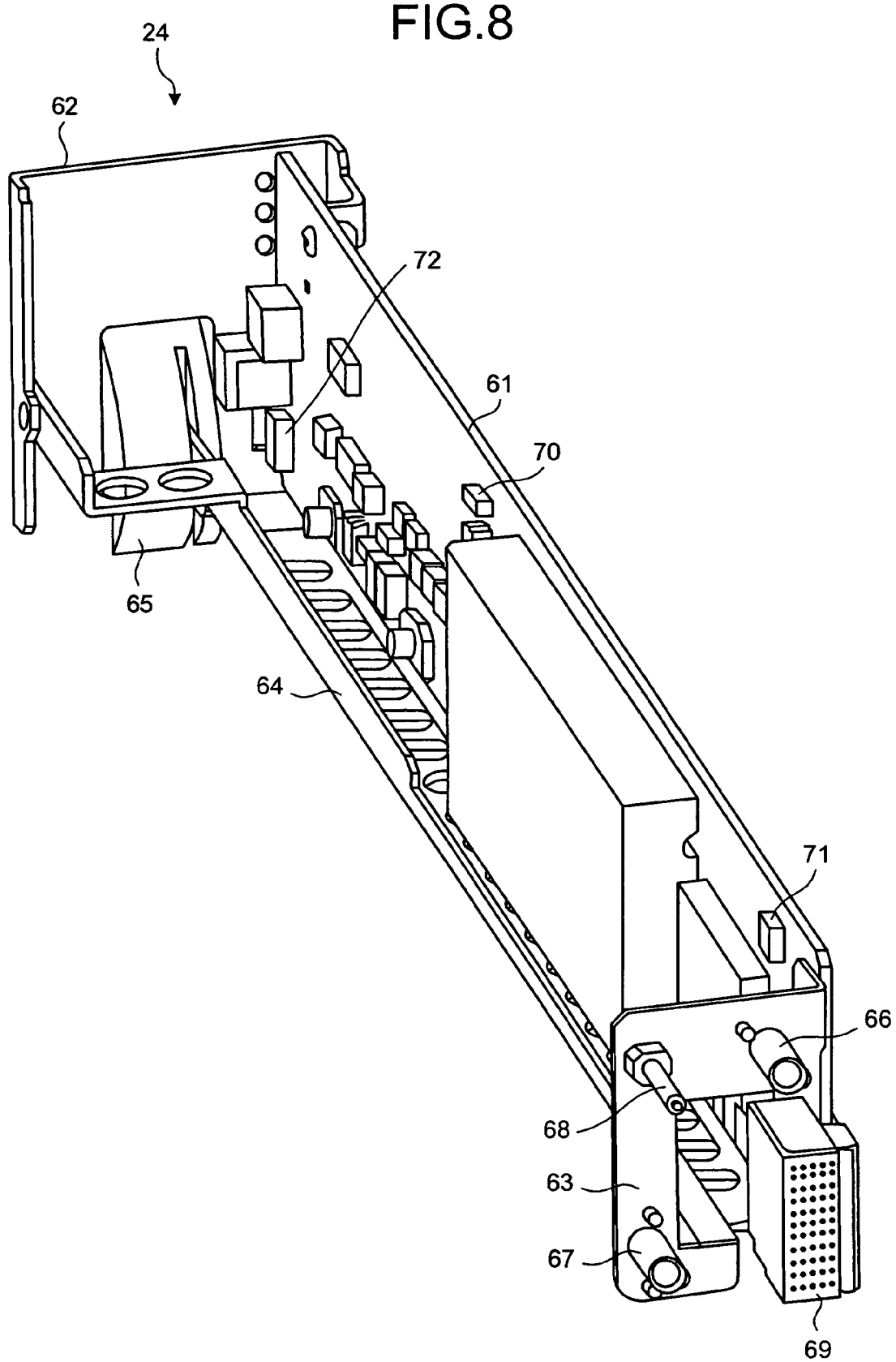
FIG. 8 is an oblique view of the card.

FIG. 7 and FIG. 8 are perspective views of the card as viewed from a front and a rear view. As illustrated in FIG. 7 and FIG. 8, the card 24 includes a PCB 61, a front plate 62, a back plate 63, a support to prevent distortion 64, an ejector 65, a plug-in connector 66, 67 (e.g., two plug-in connectors), a guide pin 68 and a back board connector 69.

On the PCB 61, a circuit pattern is configured, and an electronic component 70 is provided. A height (short side) of the PCB 61 is approximately half that of a conventional PCB configuration illustrated in FIG. 11 and FIG. 12. In addition, a length (long side) of the PCB 61 is longer than a conventional PCB by only a length corresponding to a space for a connection cable for connecting the PCB connection terminal and an external line connector. With the PCB 61, in a space that exceeds a length of a conventional PCB (hereinafter, "A"), a circuit pattern is configured and an electronic component 71 is provided.

The front plate 62 is fixed substantially perpendicularly to a front end of the PCB 61. The card ejector 65 is fixed to the front plate 62. With a conventional PCB configuration, the ejector is fixed to the PCB. Therefore, with the exemplary embodiment of the PCB 61, in a space occupied by the ejector of a conventional PCB configuration (hereinafter, "B"), a circuit pattern is configured and an electronic component 72 is provided. In this manner, the aforementioned A and aforementioned B serve as areas for circuit formation, thereby enabling the circuitry of a conventional PCB configuration or an equivalent within a PCB height approximately one half that of a conventional PCB configuration.

The support 64 is attached along a bottom edge of the PCB 61 and in a position such that it just clears a part of the lower guide rails 41, 43 that protrude upward from the first and second bottom panels 32, 34 of the housing 21. A front end portion of the support 64 is bent back and fixed to the front plate 62. A rear end portion of the support 64 is bent back to become the back plate 63 substantially perpendicular to the PCB 61 that is fixed to a rear end portion of the PCB 61.

A top end of the back plate 63 in proximity of the PCB 61 is lower than a top edge of the PCB 61 by a distance corresponding to a part of the upper guide rails 40, 42 that protrude downward from the first and second top panels 31, 33 of the housing 21. In this manner, the front plate 62, the back plate 63, and the support 64 are integrated. Further, the support 64 and the back plate 63 may also be separate independent bodies.

The first plug-in connector 66 is provided on an upper portion of the back plate 63 in a position near the PCB 61. The second plug-in connector 67 is provided in a position away from the PCB, provided that the position is at a height different from that of the first plug-in connector 66, e.g., a position lower than that of the first plug-in connector 66.

The guide pin 68 is provided on the back plate 63 in a position that does not interfere with the first and the second plug-in connectors 66, 67. A distance that the guide pin 68 protrudes from the back plate 63 is greater than a distance that the first and the second plug-in connectors 66, 67 protrude from the back plate 63. The back board connector 69 is provided in a position on a back end of the PCB 61 that does not interfere with any of the following: the first plug-in connector 66, second plug-in connector 67, and the guide pin 68.

Figure 9:
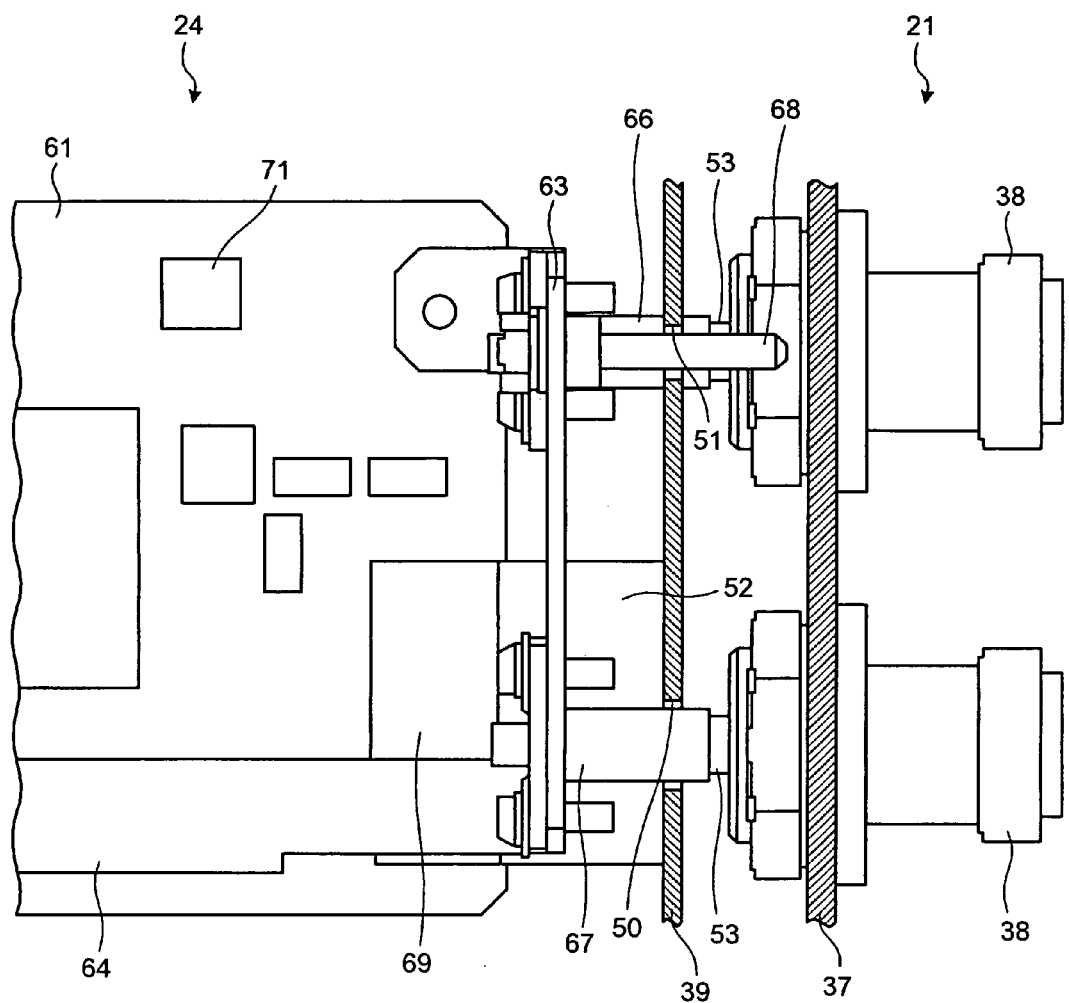
FIG. 9 is a cross-sectional view of a card mounting configuration according to the embodiment illustrating primary parts.

FIG. 9 is a sectional view of the primary parts of a card mounting configuration according to the embodiment. As illustrated in FIG. 9, the first and the second plug-in connectors 66, 67 of the card 24 pass through the connection hole 50 of the back board 39 and are connected to a part 53 of the external line connector 38 that is exposed on an interior side of the housing 21. In this manner, without mediation of a cable similar to that of a conventional configuration, the card 24 and the external line connector 38 are directly connected by a plug-in configuration. In addition, the guide pin 68 of the card 24 passes through the positioning hole 51 of the back board 39. The back board connector 69 of the card 24 is connected to the card connector 52 of the back board 39.

When the card 24 is inserted, it is inserted from the front opening of the housing 21 along the positioning guide 47 and is guided by the guide rails 40, 41, 42, 43 to a back of the housing 21. Then, the guide pin 68 goes into the positioning hole 51 of the back board 39. As a result, position of the card 24 is finely adjusted with respect to the back board 39. Subsequently, the plug-in connectors 66, 67 go into the connection hole 50 of the back board 39, are connected to the part 53 of the external line connector 38 that is exposed on an interior side of the housing 21 and the back board connector 69 is connected to the card connector 52.

Figure 10:
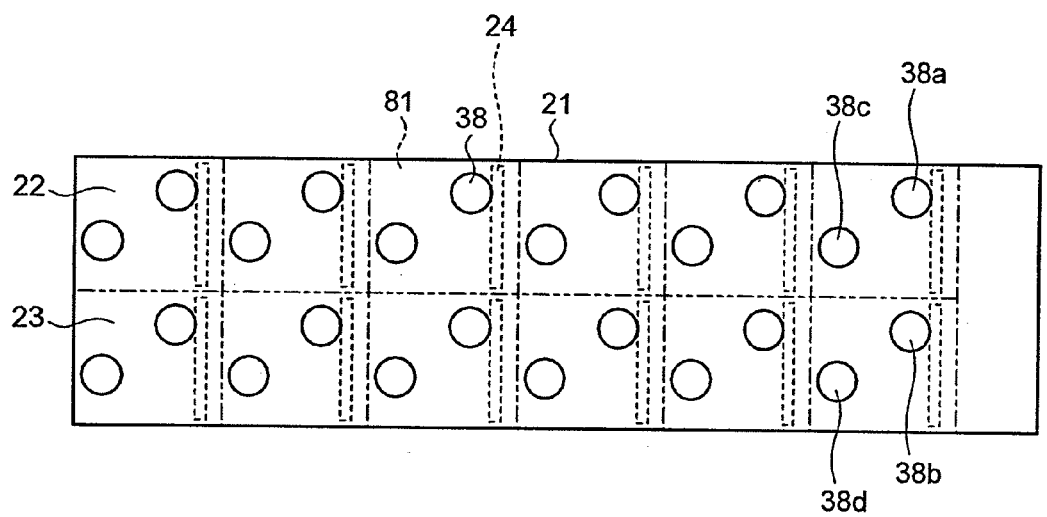
FIG. 10 is a schematic diagram of the card mounting configuration according to the embodiment.

FIG. 10 illustrates a card mounting configuration according to the embodiment as viewed from a back side of the device. As illustrated in FIG. 10, similar to a conventional configuration, the external line connectors 38 of the embodiment are arranged in alternating staggered positions and the distances X, Y, and Z between the connectors as defined in the explanation of a conventional configuration are also maintained. However, external line connectors 38a, 38c corresponding respectively to a first and a second external line connector (reference symbols 4a, 4c respectively in FIG. 11) of a conventional configuration are for cards inserted into the upper shelf 22.

Figure 11:
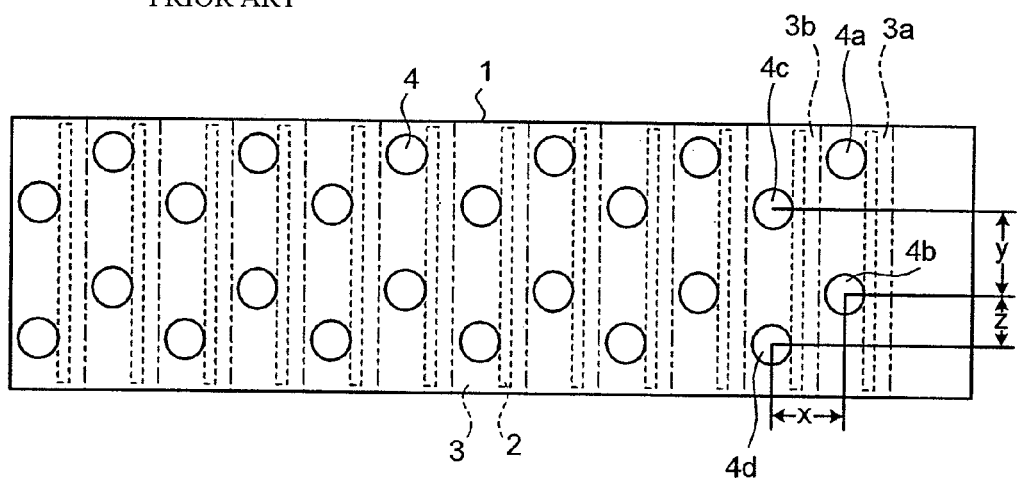
FIG. 11 is a schematic diagram of a conventional card mounting configuration.
Figure 12:
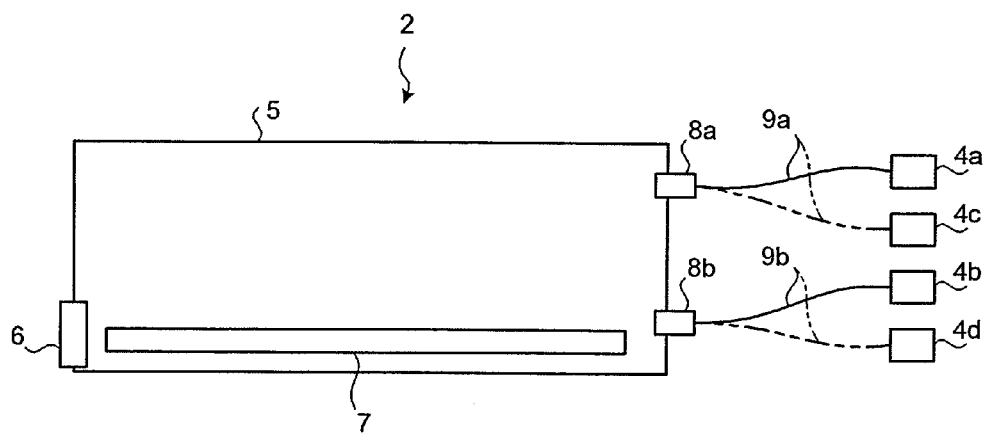
FIG. 12 is a schematic diagram illustrating a conventional card configuration and conventional wiring configuration between the card and an external line connector.

Further, external line connectors 38b, 38d corresponding to a first and a second lower external line connector of a conventional configuration (4b, 4d in FIG. 11) are for cards inserted into the lower shelf 23. Therefore, the position of the two external line connectors 38 for the card 24 are the same independent of upper shelf 22 and lower shelf mounting 23, and mounting position within any shelf 22, 23. With a conventional configuration as illustrated in FIG. 11 and FIG. 12, the height of two corresponding external line connectors differs depending on the position of card mounting, and as such the card and external line connectors must to be connected via cable. However, the embodiment enables direct connection without use of cables.

With the embodiment, six pieces of the cards 24 each are mounted into the upper and lower shelves 22, 23. Hence, a width of a storage space 81 for the card 24 is approximately twice that of a conventional configuration, i.e., lateral space between adjacent PCBs of the embodiment of the device is approximately twice that of devices having a conventional configuration. Therefore, compared to conventional configurations, heat dissipation of the exemplary embodiment of the device is excellent. Additionally, in FIG. 10, each storage space 81 of the laterally adjacent cards is indicated by a dotted reference line. However, in actuality there is no partition.

A simulation of internal temperature variations was conducted and a device having a structure in which twelve cards are arranged in two levels with six cards to a level aligned in a row according to the embodiment was compared with a device having a conventional configuration in which twelve cards are arranged in a row in a single level. Card circuitry, size of housing opening, which greatly affects heat dissipation, and current, among other conditions were the same with the exception of card mounting arrangement. Each section of the upper shelf of the exemplary embodiment of the device sustained a temperature increase ranging from 20 degrees Celsius (° C.) to 27° C. and each section of the lower shelf of the same device sustained an increase ranging from 13° C. to 18° C. On the contrary, every section of the device with a conventional configuration sustained a temperature increase ranging from 30° C. to 39° C.

As explained above, according to the embodiment, the external line connector 38 of the housing 21 and the card 24 and are connected by a plug-in configuration. Hence, easy assembly of the device can be achieved in a short period of time, e.g., time required for assembly of the device according to the embodiment is approximately one-tenth of that for a device with a conventional configuration. Further, according to the embodiment, heat dissipation is better than that of a device with a conventional configuration and as such suppression of internal temperature rises during operation can be effected.

Furthermore, according to the embodiment, through the integration of the front plate 62, the back plate 63, and the support 64 of the card 24, accuracy of installation positions of the ejector 65, the plug-in connectors 66, 67, and the support 64 becomes high, thereby enabling provision of a high quality product at a low cost. In addition, according to the embodiment, there is no space between the PCB 61 and the top panels 31, 33 of the housing 21, and no space between the PCB 61 and the bottom panels 32, 34 of the housing 21, thereby, resulting in a potential size reduction of the device.

For example, by the absence of the aforementioned space between the PCB 61 and the upper panels 31, 33 and between the PCB 61 and the lower panels 32, 34 of the housing 21; and through an effective utilization of the area for circuit configuration (the aforementioned A and B areas) that could not be afforded by conventional PCBs, the size of the device according to the embodiment is approximately 75% the size of a conventional PCB, i.e., a size reduction of approximately 25% is possible.

With regard to the card, the housing, and the card mounting configuration described above, without limitation to the aforementioned embodiments, various modifications are possible. For example, the quantity of cards inserted into each of the housing levels is not limited to six. The quantity of housing levels is not limited to two, e.g., three or more housing levels are also possible. Moreover, the number of plug-in connectors per one card may also be one, or three or more.

According to the embodiment described above, easy device assembly can be achieved in a short period of time. In addition, excellent heat dissipation is provided and temperature rises that occur during operation can be suppressed. The size of the device can also be reduced. Moreover, a low cost, high quality product can be achieved.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A card comprising:
   a printed circuit board that includes a circuit pattern and an electronic component;
   a front plate that is substantially perpendicularly attached to a front end of the printed circuit board;
   a back plate that is substantially perpendicularly attached to a rear end of the printed circuit board;
   a support to prevent card distortion that is attached along a direction of a length of the printed circuit board, wherein a front end and a rear end of the support are supported by the front and the back plates, the back plate comprising first and second plug-in connectors arranged diagonally and connected to an external line connector of a housing by a staggered plug-in configuration; and
   a back board connector, connected to a back board located on an interior side of the housing.

2. The card according to claim 1, wherein, the first plug-in connector is provided on the back plate in a position in proximity to the printed circuit board, and the second plug-in connector is provided on the back plate in a position away from the printed circuit board at a different height from the first plug-in connector.

3. The card according to claim 1, wherein an ejector unit is attached to the support.

4. The card according to claim 1, wherein the back plate includes a guide pin that passes through a hole to position a back board of the housing.

5. The card according to claim 1, wherein the back board connector is connected to the back board of the housing, on the rear end thereof.

6. A housing comprising:
   an upper shelf that is formed by a first upper panel and a first lower panel, the upper shelf in which a plurality of cards is arranged in a single row;
   a lower shelf that is formed by a second upper panel and a second lower panel, the lower shelf in which a plurality of cards is arranged in a single row;
   a pair of side panels that support the first upper panel, the first lower panel, the second upper panel, and the second lower panel;
   a back panel to cover a back side of the upper shelf and the lower shelf;
   a plurality of external line connectors protruding from the back panel in an alternating staggered arrangement; and
   a back board that is positioned in proximity to the back panel, wherein
   the back board is provided with holes through which a plug-in connector passes for connection to the external line connector that protrudes from a back end of a card.

7. The housing according to claim 6, wherein a guide rail for a card to be inserted into a shelf is formed by bending a part of each of the first upper panel, the first lower panel, the second upper panel, and the second lower panel.

8. The housing according claim 7, wherein the upper shelf and the lower shelf have a card positioning guide to position a card to be inserted therein, on a front end part of each of the upper shelf and the lower shelf at a position extending from the guide rails.

9. The housing according to claim 6, wherein a positioning hole through which a guide pin protruding from a back end of the card passes is provided on the back board.

10. The housing according to claim 6, wherein the back board includes a connector to which the card is connected.

11. The housing according to claim 6, wherein the side panel, the first upper panel, the first lower panel, the second upper panel, and the second lower panel are constructed of stainless steel.

12. The housing according to claim 11, wherein at least one of the side panel, the first upper panel, the first lower panel, the second upper panel, and the second lower panel includes a stainless steel portion that is grounded to the earth.

13. A card mounting configuration comprising:
   a card including a printed circuit board that includes a circuit pattern and an electronic component;
   a front plate that is substantially perpendicularly attached to a front end of the printed circuit board;
   a back plate that is substantially perpendicularly attached to a rear end of the printed circuit board; and
   a support to prevent card distortion that is attached along a direction of a length of the printed circuit board, wherein
   a front end and a rear end of the support are supported by the front and the back plates, and
   the back plate includes a first and second plug-in connectors connected to an external line connector of a housing by a plug-in configuration, and a back board connector; and
   a housing including
   an upper shelf that is formed by a first upper panel and a first lower panel, the upper shelf in which the cards are arranged in a single row;
   a lower shelf that is formed by a second upper panel and a second lower panel, the lower shelf in which the cards are arranged in a single row;
   a pair of side panels that support the first upper panel, the first lower panel, the second upper panel, and the second lower panel;
   a back panel to cover a back side of the upper shelf and the lower shelf;
   a plurality of external line connectors protruding from the back panel in an alternating staggered arrangement; and
   a back board that is positioned in proximity to the back panel, wherein
   the back board is provided with connection holes through which the plug-in connectors pass for connection to the external line connector that protrudes from a back end of the card.

14. The card mounting configuration according to claim 13, wherein the back plate includes a guide pin, the back board includes a positioning hole through which the guide pin passes, and the first and second plug-in connectors pass through the connection hole and is connected to the external line connector.

* * * * *